United States Patent [19]

Minami et al.

[11] Patent Number: 5,454,013
[45] Date of Patent: Sep. 26, 1995

[54] AMPLITUDE MODULATION METHOD AND BROADCASTING APPARATUS FOR CARRYING OUT THE METHOD

[75] Inventors: Michitosi Minami; Yutaka Kojima; Tetsuroh Miyazaki; Kazuhisa Hayeiwa; Hisashi Naka; Kazuaki Wakai; Tohru Mizokami, all of Tokyo, Japan

[73] Assignees: Japan Radio Co., Ltd.; Nippon Hoso Kyokai, both of Tokyo, Japan

[21] Appl. No.: 69,922

[22] Filed: Jun. 1, 1993

[30] Foreign Application Priority Data

Jun. 3, 1992 [JP] Japan .................... 4-143032

[51] Int. Cl.$^6$ ............................................. H03C 1/00
[52] U.S. Cl. .................. 375/297; 375/296; 375/300; 455/108; 341/100; 332/159
[58] Field of Search ................... 330/278, 297; 455/108–109, 114, 127; 341/110, 141; 375/216, 285–286, 268, 296–297, 300–301; 332/149, 159

[56] References Cited

U.S. PATENT DOCUMENTS

| | | | |
|---|---|---|---|
| 3,877,023 | 4/1975 | Spicer et al. ............................ | 341/141 |
| 4,403,197 | 9/1983 | Swanson ................................. | 330/10 |
| 4,581,725 | 4/1986 | Pilarcik, Jr. ............................ | 375/317 |
| 4,860,010 | 8/1989 | Iwamatsu ................................. | 375/287 |
| 5,124,979 | 6/1992 | Matui ..................................... | 375/286 |
| 5,289,496 | 2/1994 | Nakagawa et al. ..................... | 375/354 |

FOREIGN PATENT DOCUMENTS 62-281521  7/1987  Japan .

OTHER PUBLICATIONS

Hirano, Shinya, "Digitally Implemented Medium Frequency Transmitter and Its Application", Hoso Gijutsu, Apr. 1991, pp. 119–125.

*Primary Examiner*—Young Tse
*Attorney, Agent, or Firm*—Spensley Horn Jubas & Lubitz

[57] ABSTRACT

An amplitude modulation system. An input analog signal indicating audio, etc., is converted into a digital form and the low-order bits of the resultant digital signal are converted into analog form. The resultant analog signal is used to control a gain of an analog controlled amplifier. On the other hand, a plurality of digitally controlled amplifiers are selectively turned on/off in response to the value of the high-order bits of the digital signal. Carrier amplified by the analog controlled amplifier are combined with carriers amplified by the plurality of digitally controlled amplifiers. Comparatively rough amplitude constituents are provided by outputs of the plurality of digitally controlled amplifiers and comparatively fine amplitude constituents are provided by output of the analog controlled amplifier.

15 Claims, 6 Drawing Sheets

AMPLITUDE MODULATION METHOD AND BROADCASTING APPARATUS FOR CARRYING OUT THE METHOD

BACKGROUND OF THE INVENTION

1. Field of the Invention

This invention relates to an amplitude modulation method and a broadcasting apparatus to which the method is applicable, and more particularly to technologies for simplifying the power amplifier and power supply circuit configuration.

2. Description of the Related Art

A digital modulation system that can be used with a fully solid state radio broadcasting apparatus is described in "Digitally Implemented Medium Frequency Transmitter And Its Application" written by Shinya HIRANO on pages 119–125 of the April 1991 issue of Hoso Gijutsu (Broadcasting Technologies).

In the modulation system, analog-to-digital (A/D) conversion of audio signals of modulation signals is first made by a 12-bit A/D converter to provide 12-bit digital audio signals. The high-order six bits of the digital audio signal are used to control the on-off states of 42 big step modules and the low-order six bits to control the on-off states of six binary modules.

The big step modules and binary modules are power amplifiers which amplify RF carriers. The gains of the six binary modules are ½, ¼, ⅛, 1/16, 1/32, and 1/64 those of the big step modules respectively. RF outputs of the big step modules and binary modules are added together, and the resultant RF signals are transmitted. Therefore, the amplitude of the resultant RF signal can be changed in big steps by selectively turning on and off the big step modules; it can be more finely changed by selectively turning on and off the binary modules. This shows that amplitude-modulated waves can be obtained as the resultant RF signals after combining by controlling the on-off states of the big step modules and binary modules.

Thus, hitherto, a large number of power amplifiers whose on-off states can be controlled have been used to digitally generate amplitude-modulated waves. In the example given above, 42 big step modules and six binary modules, namely, 48 power amplifiers are used in total. The configuration of a broadcasting apparatus is enlarged by using a large number of power amplifiers. Therefore, it is not economical to adopt such a configuration for a transmitter having a comparatively small output capability of about 1 kW.

Further, generally the power supply voltages of power amplifiers must be made different according the output specifications of the power amplifiers. In the example given above, the supply voltage of each big step module is 230V; the supply voltages of the four binary modules having outputs of ½, ¼, ⅛, and 1/16 that of the big step module are each 115V; and the supply voltages of the two binary modules having outputs 1/32 and 1/64 that of the big step module are each 30V. Thus, in the conventional apparatus, a number of voltages must be provided as power amplifier supply voltages and complication of the power circuit configuration is inevitable.

Figure 1:
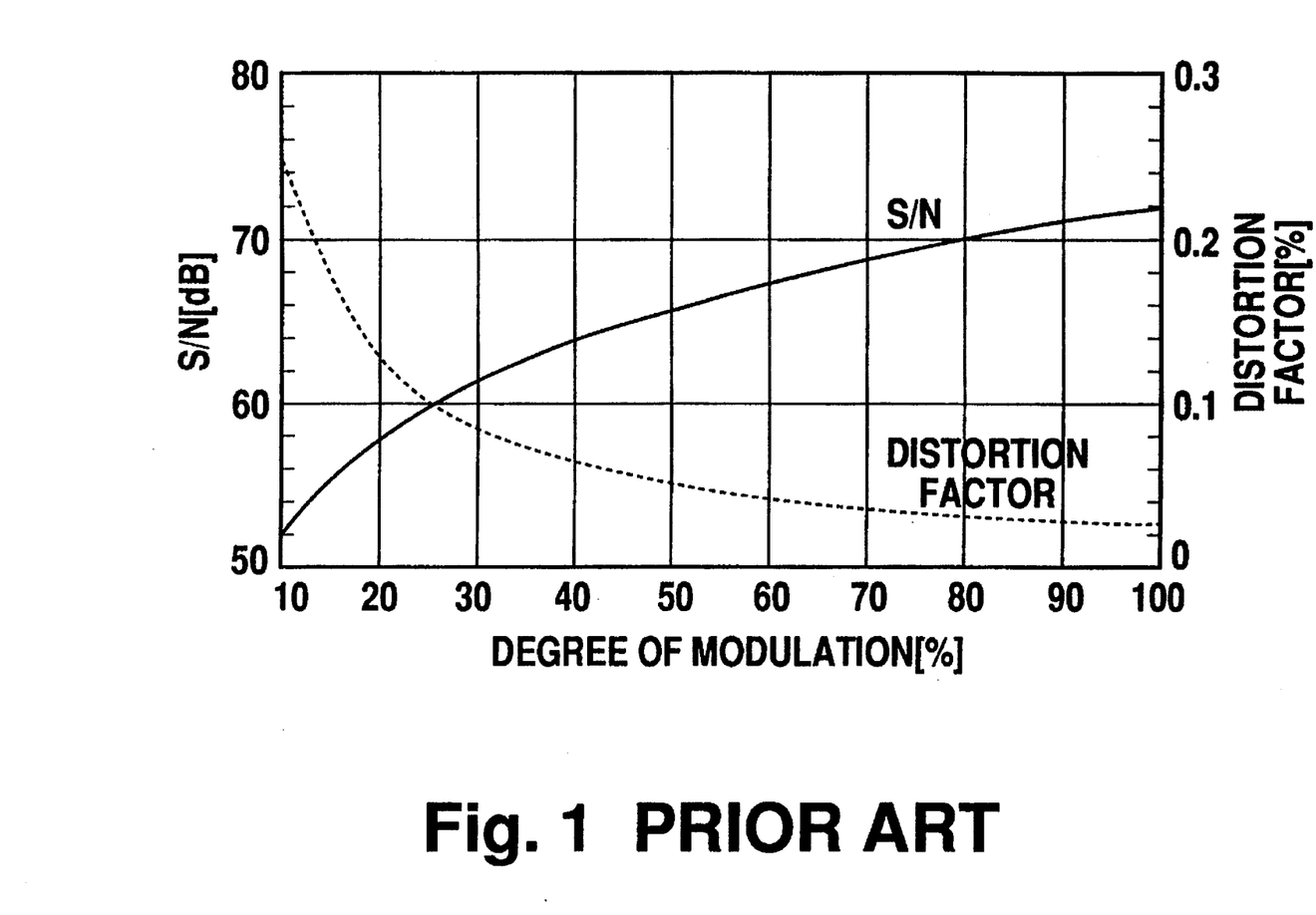
FIG. 1 is a graph showing the relationship between degree of modulation and distortion factor and S/N ratio.

Further, since the modulation system described above adopts uniform quantization as the quantization method, quantizing noise increases rapidly as the amplitude of an audio signal input as a modulation signal becomes small. This causes the S/N ratio to lower and the distortion factor to increase. As shown in FIG. 1, the distortion factor when the degree of modulation is 10% (that is, when the input audio signal amplitude is comparatively small) is about 10 times higher than when the degree of modulation is 100% (that is, when the input audio signal amplitude is comparatively large).

SUMMARY OF THE INVENTION

Accordingly, it is an object of the invention to provide a modulation system which can reduce the number of power amplifiers used to digitally generate amplitude-modulated waves, namely, an economical modulation system suitable for a transmitter having a comparatively small output capability.

It is another object of the invention to provide an economical modulation system which eliminates the need for using a number of power supplies with different specifications to drive power amplifiers.

It is a further object of the invention to provide a modulation system which can prevent quantizing noise from causing characteristic degradation.

It is an additional object of the invention to form a broadcasting apparatus using the modulation system of the invention.

It is another object of the invention to provide a harmonic distortion compensation circuit suitable for the modulation system of the invention.

To these ends, according to one aspect of the invention, there is provided an amplitude modulation method comprising:

a) a first step of converting low-order bits of an input digital signal into analog form for generating an analog signal for gain control;

b) a second step of controlling a gain of an analog controlled amplifier by the analog gain control signal;

c) a third step of controlling the state of a digitally controlled amplifier from on to off or from off to on according to high-order bits of the input digital signal; and d) a fourth step of combining an analog controlled amplifier output with a digitally controlled amplifier output for generating an amplitude-modulated wave.

The analog controlled amplifier is responsive to the value of the analog gain control signal for amplifying and outputting a carrier in analog form. The digitally controlled amplifier, when on, amplifies and outputs a carrier to a predetermined amplitude and when off, does not amplify or output it.

According to another aspect of the invention, there is provided an amplitude modulation circuit comprising:

a) digital-to-analog conversion means for converting low-order bits of an input digital signal into analog form to generate an analog signal for gain control;

b) an analog controlled amplifier which is responsive to the value of the analog gain control signal for amplifying a carrier in analog form;

c) a digitally controlled amplifying section which is responsive to the value of high-order bits of the input digital signal for digitally amplifying a carrier; and d) means for combining the carrier amplified in analog form with the digitally amplified carrier for generating an amplitude-modulated wave according to the digital signal.

According to the invention, there is provided a broadcasting apparatus comprising:

a) digital-to-analog conversion means for converting low-order bits of an input digital signal having a program to be broadcasted into analog form to generate an analog signal for gain control;

b) an analog controlled amplifier which is responsive to the value of the analog gain control signal for amplifying a carrier in analog form;

c) a digitally controlled amplifier which is responsive to the value of high-order bits of the digital signal for digitally amplifying a carrier; and d) means for combining the carrier amplified in analog form with the digitally amplified carrier for generating an amplitude-modulated wave according to the digital signal.

In the invention, the digitally controlled amplifier or the digitally controlled amplifying section is controlled according to the high-order bits of an input digital signal and the analog controlled amplifier is controlled according to the low-order bits.

The digitally controlled amplifier or amplifying section is turned on or off in response to the value of the high-order bits of the digital signal. The digitally controlled amplifier or amplifying section amplifies a carrier to a predetermined amplitude. Thus, the comparatively rough amplitude constituents of the amplitude-modulated wave to be output are controlled according to the high-order bits of the digital signal.

The gain of the analog controlled amplifier is controlled by an analog signal into which the low-order bits of the input digital signal are converted. The analog controlled amplifier amplifies a carrier with the gain conforming to the value of the analog signal. Thus, the comparatively fine amplitude constituents of the amplitude-modulated wave to be output are controlled according to the low-order bits of the digital signal.

Since the invention adopts such a configuration, the number of power amplifiers used to digitally generate an amplitude-modulated wave can be decreased. This is indicated by the fact that a single analog controlled amplifier is used in place of the conventional binary modules. The configuration can be implemented because the low-order bits of an input digital signal into which an input analog signal is converted are again converted into analog form. As a result, an economical modulation system suitable for a comparatively small output transmitter can be provided.

Further, since a plurality of binary modules are eliminated, a plurality of power supplies with different specifications need not be used to drive the power amplifiers; an economical modulation system is also enabled from this aspect.

If the number of quantization bits is increased to reduce quantizing noise, unlike the conventional case the number of binary modules does not increase. Therefore, quantizing noise can be prevented from causing characteristic degradation while the simple configuration is maintained.

As described above, the invention adopts digital-to-analog conversion means. To use a general purpose D/A converter as the digital-to-analog conversion means, harmonic distortion caused by settling introduces a problem. A harmonic distortion compensation circuit of the invention can be used in the invention and compensates for harmonic distortion caused by settling, the compensation circuit comprising:

a) a plurality of digital-to-analog converters, each of which converts a digital signal into an analog signal wherein output of each of the digital-to-analog converters contains harmonic distortion caused by settling;

b) switch means for selectively supplying outputs of the digital-to-analog converters to the circuit at the following stage; and c) timing control means for operating the digital-to-analog converters alternately and controlling operation of the switch means in synchronization with the alternate operation so as to remove the harmonic distortion from the signal supplied to the following stage.

In the invention, since the digital-to-analog converters are operated alternately and switch output is executed in synchronization with the alternate operation, even if the digital-to-analog converter output contains harmonic distortion caused by settling, the distortion can be removed, thereby remarkably improving the amplitude-modulated wave quality.

The input digital signal mentioned above may be generated by converting an input analog signal containing audio information, etc., into digital form. As a technique of controlling the operation of the digitally controlled amplifier or amplifying section, the method can be adopted by which first the high-order bits of an input digital signal are converted into an on/off control digital signal which then is fed into the digitally controlled amplifier. Further, if the digitally controlled amplifying section is made up of a plurality of digitally controlled amplifiers, the bits of the on/off control digital signal may be related to the digitally controlled amplifiers. A carrier may be given by oscillation means to the analog controlled amplifier and the digitally controlled amplifying section. A supply voltage may be given by power supply means to the analog controlled amplifier and the digitally controlled amplifying section.

BRIEF DESCRIPTION OF THE DRAWINGS

In the accompanying drawings:

FIG. 3(a) shows a modulated waveform corrected by an analog controlled power amplifier; FIG. 3(b) shows an output waveform of an analog controlled power amplifier required to provide such a waveform; FIG. 3(c) shows an output waveform of a D/A converter required for this purpose; and FIG. 3(d) shows an actual D/A converter output waveform, particularly waveform distortion caused by its settling time;

FIG. 6(a) shows an output waveform of D/A converter 16; FIG. 6(b) shows an output waveform of D/A converter 17; FIG. 6(c) shows a D/A switch signal waveform output from timing generator 18; and FIG. 6(d) shows a waveform output from change-over switch 20.

DESCRIPTION OF THE PREFERRED EMBODIMENTS

Referring now to the accompanying drawings, there are shown preferred embodiments of the invention.

First Embodiment

Figure 2:
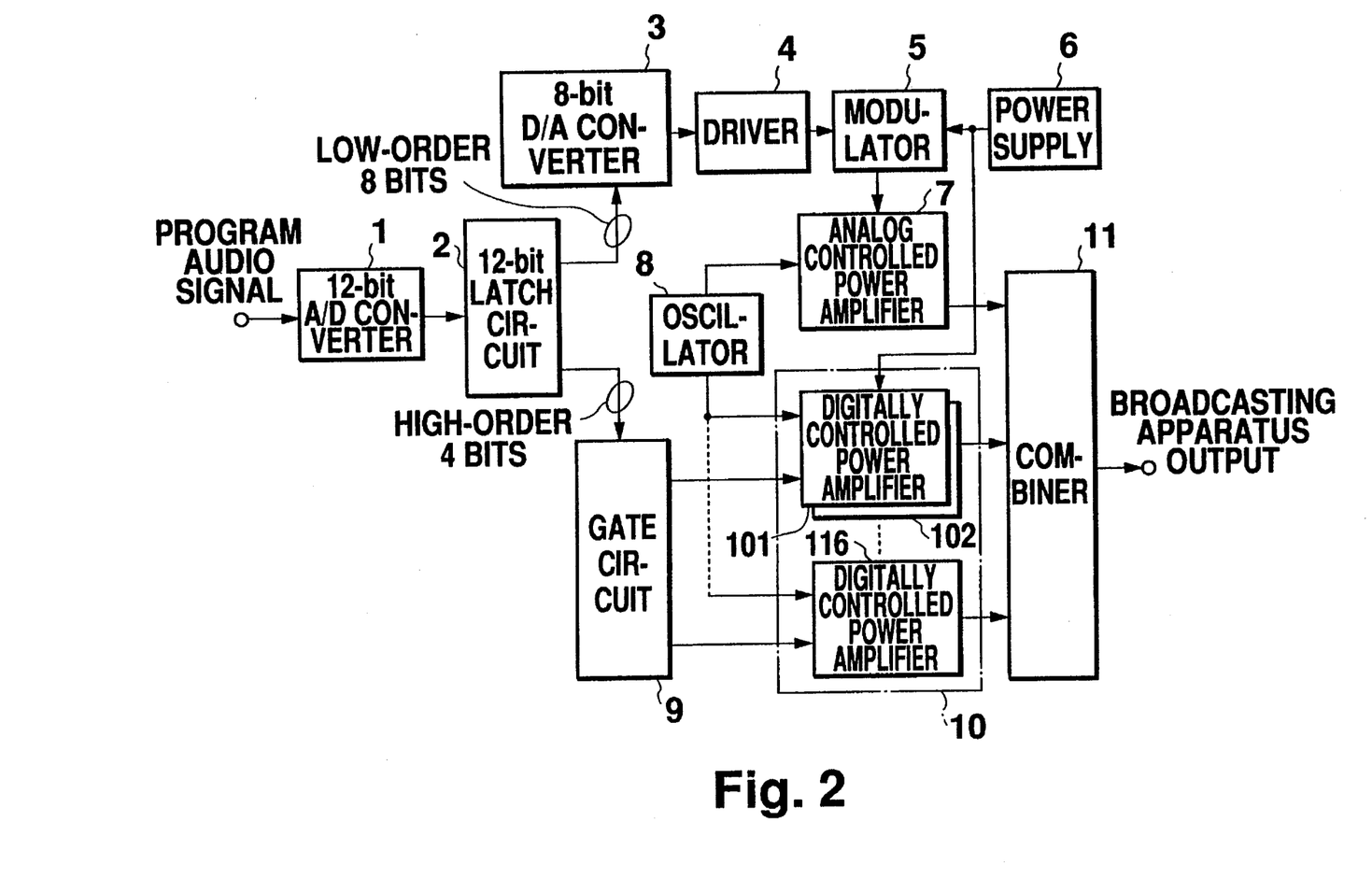
FIG. 2 is a block diagram showing the configuration of a fully solid state medium frequency radio broadcasting apparatus according to a first embodiment of the invention.

FIG. 2 shows the configuration of a medium frequency radio broadcasting apparatus according to a first embodiment of the invention. This broadcasting apparatus is a fully solid state medium frequency radio broadcasting apparatus having a 1-kW output capability.

The broadcasting apparatus comprises an A/D converter 1 which converts program audio signals into 12-bit digital audio signals, followed by a 12-bit latch circuit 2 which latches the digital audio signal output from the A/D converter 1. The low-order (LSB side) 8 bits of the digital audio signal latched by the latch circuit 2 are fed into a digital-to-analog (D/A) converter 3 and the high-order (MSB side) four bits are fed into a gate circuit 9, respectively.

The D/A converter 3 converts the low-order 8 bits of the digital audio signal into analog form. A driver 4 following the D/A converter 3 amplifies the analog signal output from the D/A converter 3 and feeds the amplified analog signal into a modulator 5. The modulator 5 uses the analog signal fed from the driver 4 to amplitude-modulate a supply voltage fed from a power supply 6.

An analog controlled power amplifier 7 is an amplifier whose gain can be controlled by an analog control signal fed from an external device or system as driving power. In the first embodiment, the gain of the analog controlled power amplifier 7 is controlled by the output signal of the modulator 5. The analog controlled power amplifier 7 amplifies carriers supplied from an oscillator 8.

Therefore, the output amplitude of the analog controlled power amplifier 7 is controlled by the low-order 8 bits of the digital audio signal. The low-order 8 bits provide information on a comparatively fine amplitude in the digital audio signal. Thus, in the embodiment, comparatively fine amplitude constituents of large amplitude-modulated waves to be output by the broadcasting apparatus are obtained from the analog controlled power amplifier 7.

Output of the analog controlled power amplifier 7 is combined with output of a digitally controlled power amplifying section 10 by a combiner 11. The digitally controlled power amplifying section 10 consists of 16 digitally controlled power amplifiers 101 to 116.

Each of the digitally controlled power amplifiers 101 to 106 is an amplifier whose on or off state can be controlled by a digital control signal fed from an external device or system. In the embodiment, the digital control signal is supplied from the gate circuit 9. The digitally controlled power amplifiers 101 to 116 amplify carriers supplied from the oscillator 8.

The high-order four bits of the digital audio signal latched by the latch circuit 2 are fed into the gate circuit 9, as described above. The gate circuit 9 consists of, for example, a ROM, a latch circuit, etc., (not shown), and generates a 12-bit signal corresponding to the 4-bit digital signal supplied from the latch circuit 2. The bits of the signal output from the gate circuit 9 correspond to the digitally controlled power amplifiers 101 to 116.

Figure 3:
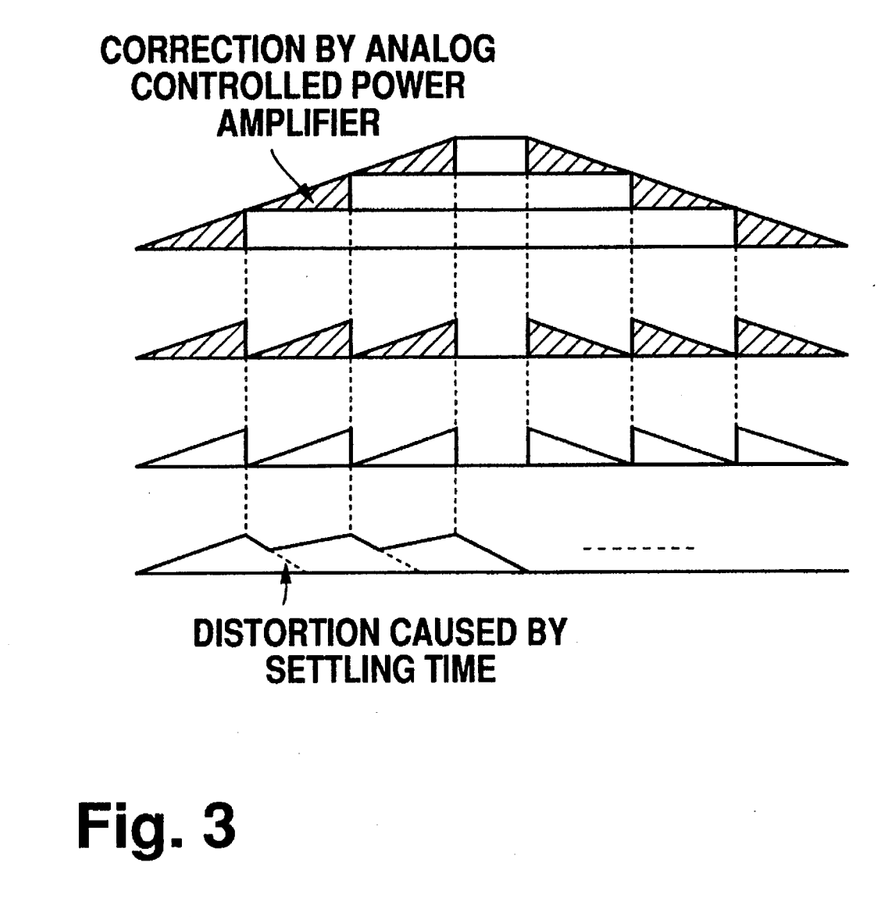
FIG. 3 is a chart for illustrating improvements according to a second embodiment of the invention.

Therefore, which or what combination of the digitally controlled power amplifiers 101 to 116 are to be turned on is determined by the value of the high-order four bits of the digital audio signal. The high-order four bits of the digital audio signal provide information on comparatively rough amplitude constituents of the digital audio signal. Therefore, comparatively rough amplitude constituents as shown by the stepped waveform in FIG. 3(a) are obtained by combining outputs of the digitally controlled power amplifiers 101 to 116.

The combiner 11 combines outputs of the analog controlled power amplifier 7 and the digitally controlled power amplifiers 101 to 116. The combiner 11 combines outputs of the digitally controlled power amplifiers 101 to 116 for generating the amplitude constituents shown as the stepped waveform in FIG. 3(a) and further combines the amplitude constituents with the output of the analog controlled power amplifier 7 (the hatched portions in FIG. 3(b)) for generating large amplitude-modulated waves to be output from the broadcasting apparatus. The generated large amplitude-modulated waves are fed to an antenna system (not shown) as broadcasting apparatus output.

Therefore, according to the first embodiment, the number of power amplifiers used to digitally generate amplitude-modulated waves can be reduced. The embodiment uses only 17 power amplifiers as one analog controlled power amplifier 7 and 16 digitally controlled power amplifiers 101 to 116. It is clear that the number of power amplifiers is remarkably reduced compared with the prior art mentioned above in which 48 power amplifiers are used. Therefore, a broadcasting apparatus having a comparatively small output capability such as 1 kW can be formed economically.

The embodiment also eliminates the need for using a plurality of power supplies with different specifications in order to drive a plurality of power amplifiers. As compared with the prior art which requires a plurality of power supplies with different specifications because a plurality of small-output binary modules are used, the embodiment enables a remarkably simple configuration of the power supply 6, thus providing a more economical broadcasting apparatus.

Hitherto, a method of increasing the number of quantization bits has been used to prevent quantizing noise from causing characteristic degradation. In the conventional modulation system, an increase in the number of quantization bits leads to an increase in the number of power amplifiers and complication of the power circuit configuration. In contrast, in the embodiment, an increase In the number of quantization bits requires only an increase in the number of bits fed from the latch circuit 2 to the D/A converter 3. Therefore, an increase in the number of quantization bits in the embodiment does not lead to an increase in the number of power amplifiers or complication of the power supply configuration. Thus, the embodiment enables the prevention of the quantization noise from causing characteristic degradation without increasing the number of power amplifiers or complicating the power supply configuration.

The broadcasting apparatus according to the embodiment of the invention has a merit of simplifying the apparatus configuration without causing characteristic degradation even compared with fully solid state radio transmitters of the PWM (pulse width modulation) system widely applied at present, and thus can be popularized worldwide.

Second Embodiment

If a commercially available D/A converter is used as the D/A converter 3 mentioned in the first embodiment, settling introduces a problem.

For example, to provide an amplitude-modulated waveform with no harmonic distortion as shown in FIG. 3(a), the analog controlled power amplifier 7 in the first embodiment must output a waveform as shown in FIG. 3(b). Since the gain of the analog controlled power amplifier 7 is controlled by output of the modulator 5, in its turn output of the D/A converter 3, the D/A converter 3 must also output a waveform as shown in FIG. 3(c) to provide an amplitude-modulated waveform with no harmonic distortion.

However, the commercially available D/A converter has a characteristic that its output is not rapidly settled. This characteristic is called settling and the settling occurring period is called the settling time. If the settling is remarkable, the D/A converter 3 outputs a waveform containing a slant caused by the settling time as shown in FIG. 3(d). This slant results in harmonic distortion in the output waveform of the analog controlled power amplifier 7.

Figure 4:
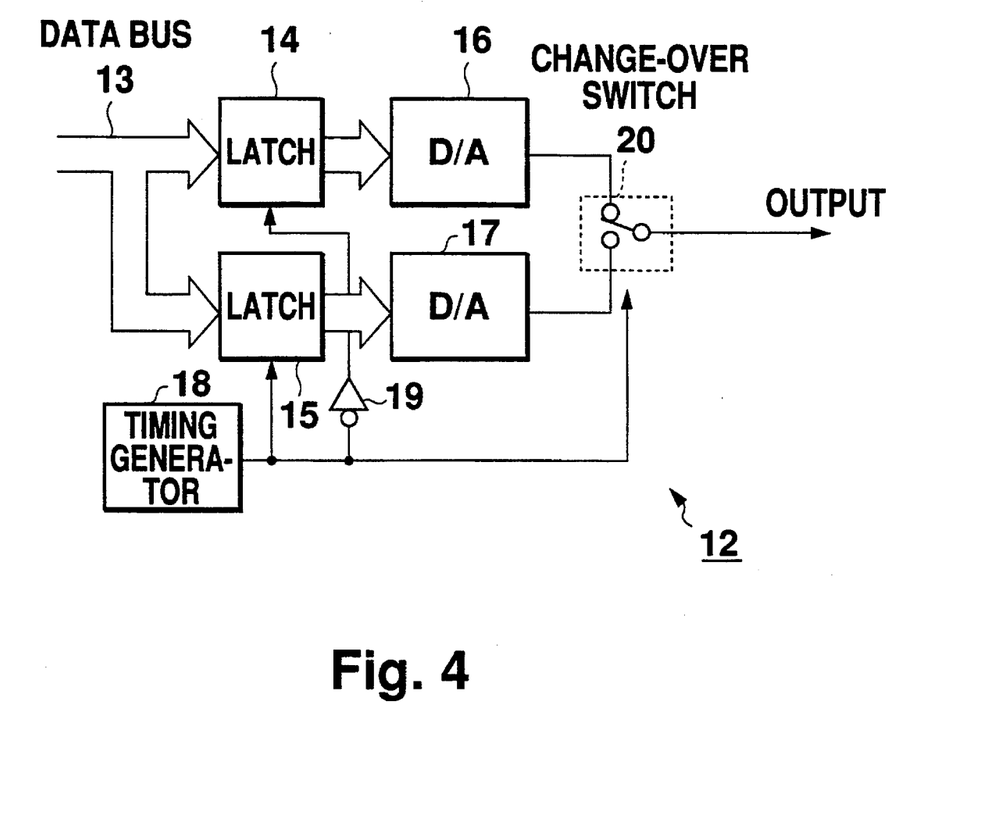
FIG. 4 is a block diagram showing the configuration of a harmonic distortion compensation circuit used in the second embodiment of the invention.
Figure 5:
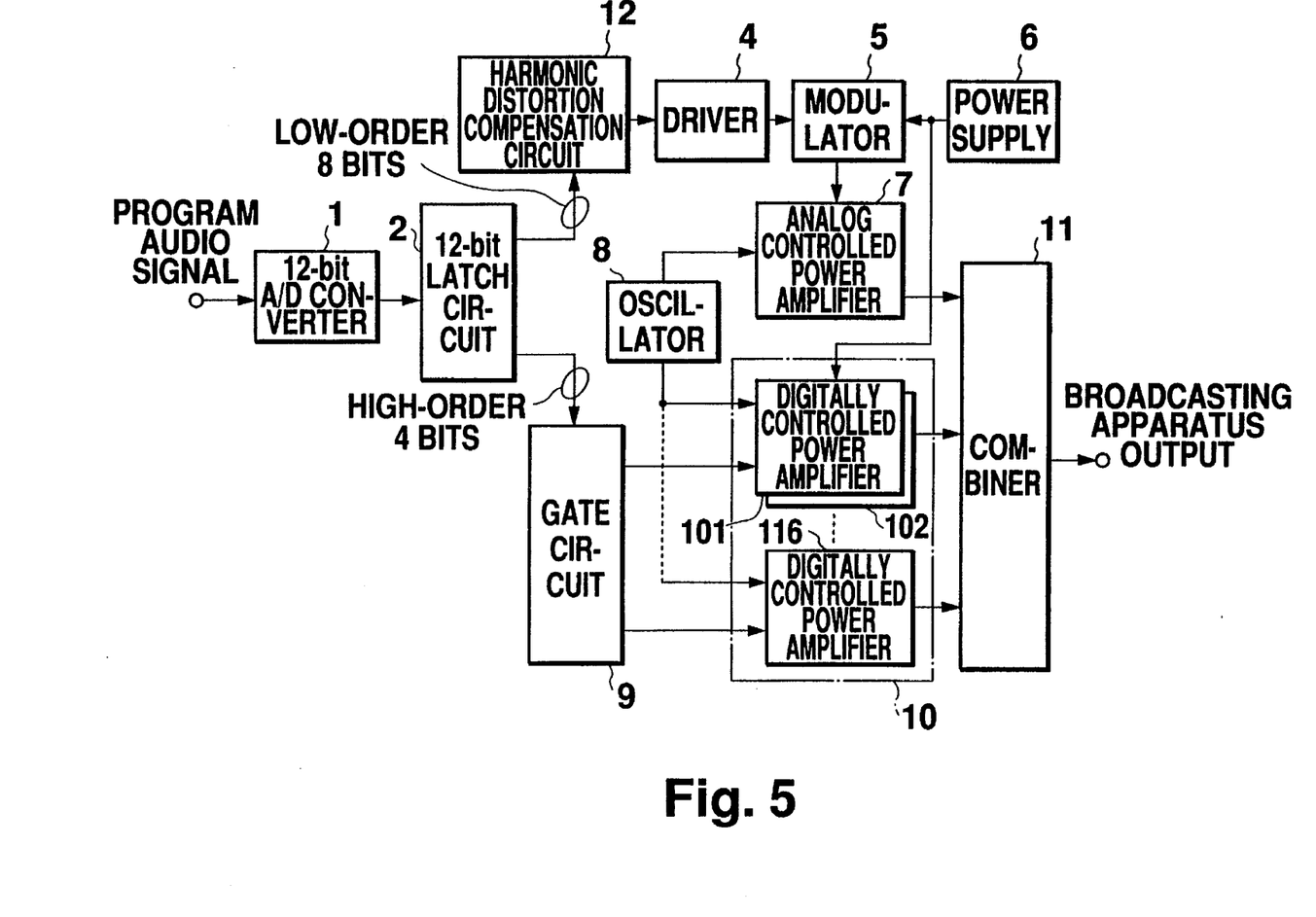
FIG. 5 is a block diagram showing the configuration of a fully solid state medium frequency radio broadcasting apparatus according to the second embodiment of the invention.

FIG. 4 shows the configuration of a harmonic distortion compensation circuit that can be used to eliminate such harmonic distortion. FIG. 5 shows the circuit configuration where the circuit shown in FIG. 4 is applied to a fully solid state medium frequency radio broadcasting apparatus, namely, the configuration of a broadcasting apparatus according to a second embodiment of the invention. Circuit parts identical with or similar to those previously described in the first embodiment are denoted by the same reference numerals in the second embodiment, and description is omitted.

The harmonic distortion compensation circuit 12 in the embodiment is located at the stage following a latch circuit 2, as shown in FIG. 5. The harmonic distortion compensation circuit 12 converts a 8-bit signal supplied from the latch circuit 2, namely, the low-order 8 bits of a digital audio signal into analog form. The resultant analog signal, like the output of the D/A converter 3 in the first embodiment, is fed via a driver 4 into a modulator 5 to control the gain of analog controlled power amplifier 7.

Unlike the D/A converter 3 in the first embodiment, the harmonic distortion compensation circuit 12 has a function which suppresses waveform distortion caused by settling or reduces it remarkably. This function is provided by the configuration shown in FIG. 4.

As shown in FIG. 4, the harmonic distortion compensation circuit 12 is provided with latch circuits 14 and 15 which latch 8-bit signals fed via a data bus 13. The latch circuits 14 and 15 are followed by D/A converters 16 and 17 respectively. Therefore, the low-order 8 bits latched by the latch circuit 14 are converted into analog form by the D/A converter 16; the low-order 8 bits latched by the latch circuit 15 are converted into analog form by the D/A converter 17.

The latch timings of the latch circuits 14 and 15 are given by a timing generator 18 which generates timing pulses synchronized with sampling clocks of the latch circuits 14 and 15. The timing pulses are fed via an inverter 19 into the latch circuit 14 and directly into the latch circuit 15. The latch circuits 14 and 15 latch the low-order 8 bits of the digital signal in response to the supplied timing pulse and its inverted pulse. Therefore, the latch timings of the latch circuits 14 and 15 become opposite in phase to each other.

The latch circuits 14 and 15 operate in opposite phases to each other. Therefore, the D/A converters 16 and 17 output analog values into which the low-order 12 bits of digital signals received at different timings are converted.

The timing generator 18 also gives a switch timing to a change-over switch 20 following the D/A converters 16 and 17. The change-over switch 20 is switched in response to the timing pulse generated by the timing generator 18. Output of the change-over switch 20 is fed to the driver 4.

Figure 6:
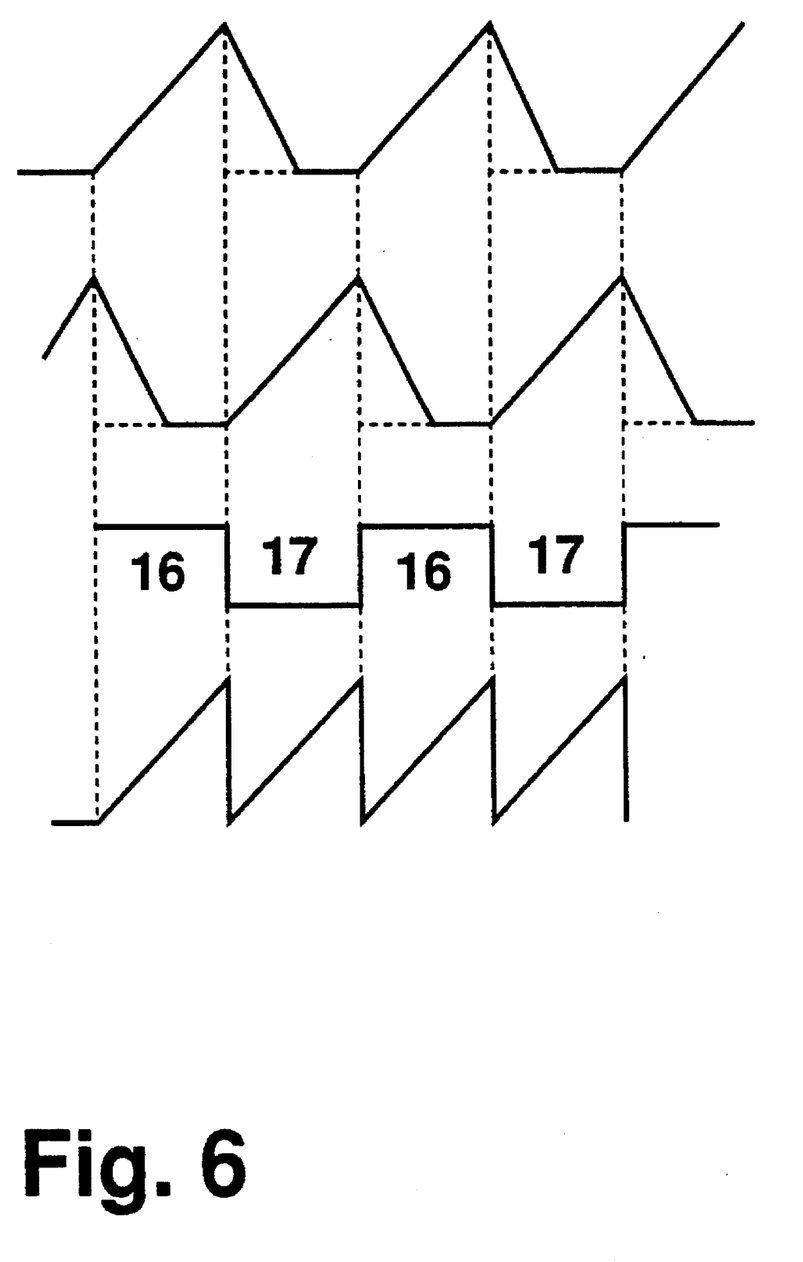
FIG. 6 is a chart showing waveforms in the second embodiment of the invention.

FIG. 6 shows how switching of the change-over switch 20 is controlled.

First, consider each of the latch circuits 14 and 15 latches data (low-order 8 bits) at the timing when a latch pulse which is high is supplied. In this case, the latch circuits 14 and 15 latch the low-order 8 bits at the timings when the timing pulse (D/A switch signal) shown in FIG. 6(c) goes high and low respectively. The D/A converters 16 and 17 convert the low-order 8 bits of the digital signal latched by the latch circuits 14 and 15, respectively, into analog form. Therefore, the waveform resulting from converting the low-order 8 bits of the digital signal into analog form appears at the output of the D/A converter 16 in the period during which the timing pulse is high and at the output of the D/A converter 17 in the period during which the timing pulse is low.

If D/A converters which can suppress settling can be used as the D/A converters 16 and 17, then the D/A converters 16 and 17 output the waveforms denoted by the broken lines in FIGS. 6(a) and 6(b) respectively. In fact, the actual D/A converters output waveforms containing harmonic distortion caused by settling. As a result of settling, the D/A converters 16 and 17 output the waveforms denoted by the solid lines in FIGS. 6(a) and 6(b) respectively.

In the embodiment, waveform distortion is caused by settling as shown in FIG. 6, but is not output to the driver 4 because the change-over switch 20 is switched so as to send, in the following circuit, the output of the D/A converter 17 while the settling distortion appears at the output of the D/A converter 16 or the output of the D/A converter 16 while the settling distortion appears at the output of the D/A converter 17.

In more detail, the D/A converters 16 and 17 output D/A conversion waveforms and settling waveforms at alternate timings because the corresponding timing pulses are opposite in phase to each other. Therefore, if the change-over switch 20 is switched in synchronization with the alternation, only the D/A conversion waveforms with the settling waveforms eliminated can be output to the following stage. Since the alternate timings of outputs of the D/A converters 16 and 17 are determined by the timing pulses generated by the timing generator 18, if the timing pulses are used to control the switch timing of the change-over switch, analog signals containing no settling waveforms, as shown in FIG. 6(d), are provided.

Therefore, the embodiment offers the advantage of providing high-grade amplitude-modulated waveforms with no harmonic distortion in addition to the advantage offered by the first embodiment.

The invention does not limit the number of digitally controlled power amplifiers and does not limit the output capabilities of broadcasting apparatuses either. For example, the invention is applicable to a wide range of broadcasting apparatuses having output capabilities of 100 W to 100 kW or more.

What is claimed is:

1. An amplitude modulation method comprising:
    a first step of converting low-order bits of an input digital signal into analog form for generating an analog signal for gain control;
    a second step of controlling a gain of an analog controlled amplifier by the analog gain control signal;
    a third step of controlling state of a digitally controlled amplifier from on to off or from off to on according to high-order bits of the input digital signal;

a fourth step of combining the output of said analog controlled amplifier with the output of said digitally controlled amplifier for generating an amplitude-modulated wave, wherein said analog controlled amplifier is responsive to a value of said analog gain control signal for amplifying a carrier in analog form for output and said digitally controlled amplifier, when on, amplifies the carrier to a predetermined amplitude for output and when off, does not amplify or output it.

2. The amplitude modulation method as claimed in claim 1 further comprising a step of converting an input analog signal into said input digital signal.

3. The amplitude modulation method as claimed in claim 1 wherein said third step includes the steps of:

converting the high-order bits of the input digital signal into a digital signal for on/off control; and feeding the on/off control digital signal into said digitally controlled amplifier for controlling the state thereof.

4. The amplitude modulation method as claimed in claim 1 wherein said first step includes the steps of:

providing a plurality of digital-to-analog converters;

converting the low-order bits of the input digital signal into said analog form by each of said plurality of digital-to-analog converters wherein said analog signal output by each of said digital-to-analog converters contains harmonic distortion caused by settling;

selecting one of the analog signals output by said digital-to-analog converters;

supplying the selected analog signal to said analog controlled amplifier as said analog signal for gain control;

successively operating said digital-to-analog converters; and executing the selecting step in synchronization with the successive operation of said digital-to-analog converters for removing said harmonic distortion from said analog gain control signal.

5. An amplitude modulation circuit comprising:

digital-to-analog conversion means for converting low-order bits of an input digital signal into analog form to generate an analog signal for gain control;

an analog controlled amplifier which is responsive to a value of the analog gain control signal for amplifying a carrier input from an oscillator;

a digitally controlled amplifying section which is responsive to a value of high-order bits of the input digital signal for amplifying the carrier input from said oscillator; and means for combining the carrier amplified by said analog controlled amplifier with the carrier amplified by said digitally controlled amplifying section for generating an amplitude-modulated wave according to said input digital signal.

6. The amplitude modulation circuit as claimed in claim 5 further including analog-to-digital conversion means for converting an input analog signal into said input digital signal.

7. The amplitude modulation circuit as claimed in claim 5 further including:

means for converting the high-order bits of the input digital signal into a digital signal for on/off control; and means for feeding the on/off control digital signal to said digitally controlled amplifying section for controlling operation thereof.

8. The amplitude modulation circuit as claimed in claim 5 wherein said digitally controlled amplifying section comprises a plurality of digitally controlled amplifiers, each of said plurality of digitally controlled amplifiers having an on state and an off state, each of which, when in the on state, amplifies the carrier to a predetermined amplitude for output and when in the off state, does not amplify or output the carrier, said amplitude modulation circuit further including:

means for converting the high-order bits of the input digital signal into an on/off control digital signal consisting of a predetermined number of bits; and means for feeding the predetermined number of bits of said on/off control digital signal to the digitally controlled amplifiers corresponding to the predetermined number of bits for controlling operation of said digitally controlled amplifying section.

9. The amplitude modulation circuit as claimed in claim 5 further including means for oscillating the carrier.

10. The amplitude modulation circuit as claimed in claim 5 further including power supply means for supplying a supply voltage at least to said digitally controlled amplifying section.

11. The amplitude modulation circuit as claimed in claim 5 wherein said digital-to-analog conversion means comprises:

a plurality of digital-to-analog converters, each of which converts the low-order bits of the input digital signal into said analog form wherein the analog signal output by each of said digital-to-analog converters contains harmonic distortion caused by settling;

switch means for selecting one of the analog signals output by said digital-to-analog converts and for supplying the selected analog signal to said analog controlled amplifier as analog gain control signal; and timing means for successively operating said digital-to-analog converters and controlling said switch means so as to select one of said analog signals in synchronization with the successive operation of said digital-to-analog converters for removing said harmonic distortion from said analog gain control signal.

12. The amplitude modulation circuit as claimed in claim 5 wherein said input digital signal is a signal containing audio information to be broadcasted.

13. A broadcasting apparatus comprising:

digital-to-analog conversion means for converting low-order bits of an input digital signal having a program to be broadcasted into analog form to generate an analog signal for gain control;

an analog controlled amplifier which is responsive to a value of the analog gain control signal for amplifying a carrier input from an oscillator;

a digitally controlled amplifier section which is responsive to a value of high-order bits of said input digital signal for amplifying the carrier input from said oscillator; and means for combining the carrier amplified by said analog controlled amplifier with the carrier amplified by said digitally controlled amplifying section for generating an amplitude-modulated wave according to said input digital signal.

14. The broadcasting apparatus as claimed in claim 13 wherein said digital-to-analog conversion means comprises:

a plurality of digital-to-analog converters, each of which converts the low-order bits of the input digital signal into said analog form wherein the analog signal output by each of said digital-to-analog converters contains harmonic distortion caused by settling;

switch means for selecting one of the analog signals output by said digital-to-analog converts and for supplying the selected analog signal to said analog controlled amplifier as analog gain control signal; and timing means for successively operating said digital-to-analog converters and controlling said switch means so as to select one of said analog signals in synchronization with the successive operation of said digital-to-analog converters for removing said harmonic distortion from said analog gain control signal.

15. A harmonic distortion compensation circuit comprising:

a plurality of digital-to-analog converters, each of which converts low-order bits of an input digital signal into an analog signal wherein the output of each of said digital-to-analog converters contains harmonic distortion caused by settling;

switch means for selecting one of the analog signals output by said digital-to-analog converters and for supplying the selected analog signal to a circuit at a following stage; and timing means for providing successive operation of said digital-to-analog converters and controlling operation of said switch means in synchronization with the successive operation of said digital-to-analog converters so as to remove said harmonic distortion from the selected analog signal sent to said following stage.

* * * * *